United States Patent
Rode et al.

(10) Patent No.: US 11,688,788 B2
(45) Date of Patent: Jun. 27, 2023

(54) TRANSISTOR GATE STRUCTURE WITH HYBRID STACKS OF DIELECTRIC MATERIAL

(71) Applicant: INTEL CORPORATION, Santa Clara, CA (US)

(72) Inventors: Johann C. Rode, Hillsboro, OR (US); Samuel J. Beach, Aloha, OR (US); Nidhi Nidhi, Hillsboro, OR (US); Rahul Ramaswamy, Portland, OR (US); Han Wui Then, Portland, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1058 days.

(21) Appl. No.: 16/209,039

(22) Filed: Dec. 4, 2018

(65) Prior Publication Data

US 2020/0176582 A1    Jun. 4, 2020

(51) Int. Cl.
*H01L 21/02* (2006.01)
*H01L 29/51* (2006.01)
(Continued)

(52) U.S. Cl.
CPC .......... *H01L 29/513* (2013.01); *H01L 21/022* (2013.01); *H01L 21/02181* (2013.01);
(Continued)

(58) Field of Classification Search
CPC ............. H01L 29/513; H01L 21/02181; H01L 21/02189; H01L 21/28158; H01L 29/0673;
(Continued)

(56) References Cited

U.S. PATENT DOCUMENTS

2008/0242037 A1* 10/2008 Sell ................... H01L 21/3065
                                                                438/299

FOREIGN PATENT DOCUMENTS

CN        103311247 A  *  9/2013   ..... H01L 21/823842

OTHER PUBLICATIONS

Vizzina et al., "Controlled growth of aluminum oxide thin films on hydrogen terminated Si(0 0 1) surface", Journal of Crystal Growth, ScienceDirect, 2007, vol. 305, pp. 26-29.
(Continued)

*Primary Examiner* — Mohammad M Choudhry
(74) *Attorney, Agent, or Firm* — Schwabe, Williamson & Wyatt, P.C.

(57) ABSTRACT

An integrated circuit includes a gate structure in contact with a portion of semiconductor material between a source region and a drain region. The gate structure includes gate dielectric and a gate electrode. The gate dielectric includes at least two hybrid stacks of dielectric material. Each hybrid stack includes a layer of low-κ dielectric and a layer of high-κ dielectric on the layer of low-κ dielectric, where the layer of high-κ dielectric has a thickness at least two times the thickness of the layer of low-κ dielectric. In some cases, the layer of low-κ dielectric has a thickness no greater than 1.5 nm. The layer of high-κ dielectric may be a composite layer that includes two or more layers of compositionally-distinct materials. The gate structure can be used with any number of transistor configurations but is particularly useful with respect to group III-V transistors.

17 Claims, 6 Drawing Sheets

(51) Int. Cl.
  *H01L 29/06*    (2006.01)
  *H01L 29/423*   (2006.01)
  *H01L 29/49*    (2006.01)
  *H01L 29/786*   (2006.01)
  *H01L 29/66*    (2006.01)
  *H01L 29/78*    (2006.01)
  *H01L 21/28*    (2006.01)

(52) U.S. Cl.
  CPC .. *H01L 21/02189* (2013.01); *H01L 21/28158* (2013.01); *H01L 29/0673* (2013.01); *H01L 29/42364* (2013.01); *H01L 29/42392* (2013.01); *H01L 29/4908* (2013.01); *H01L 29/517* (2013.01); *H01L 29/66742* (2013.01); *H01L 29/66795* (2013.01); *H01L 29/7851* (2013.01); *H01L 29/78696* (2013.01)

(58) Field of Classification Search
  CPC ......... H01L 29/42364; H01L 29/42392; H01L 29/4908; H01L 29/517; H01L 29/66742; H01L 29/66795; H01L 29/7851; H01L 29/78696
  See application file for complete search history.

(56) References Cited

OTHER PUBLICATIONS

Rammula et al., "Atomic layer deposition of aluminum oxide films on graphene", IOP Conference Series: Materials Science and Engineering, 2013, vol. 49, 5 pages.

* cited by examiner

TRANSISTOR GATE STRUCTURE WITH HYBRID STACKS OF DIELECTRIC MATERIAL

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits. A thin-film transistor (TFT) is one type of FET that can be fabricated on a substrate, for example, by depositing and patterning thin films of semiconductor material, dielectric material, and metal.

Figure 1:
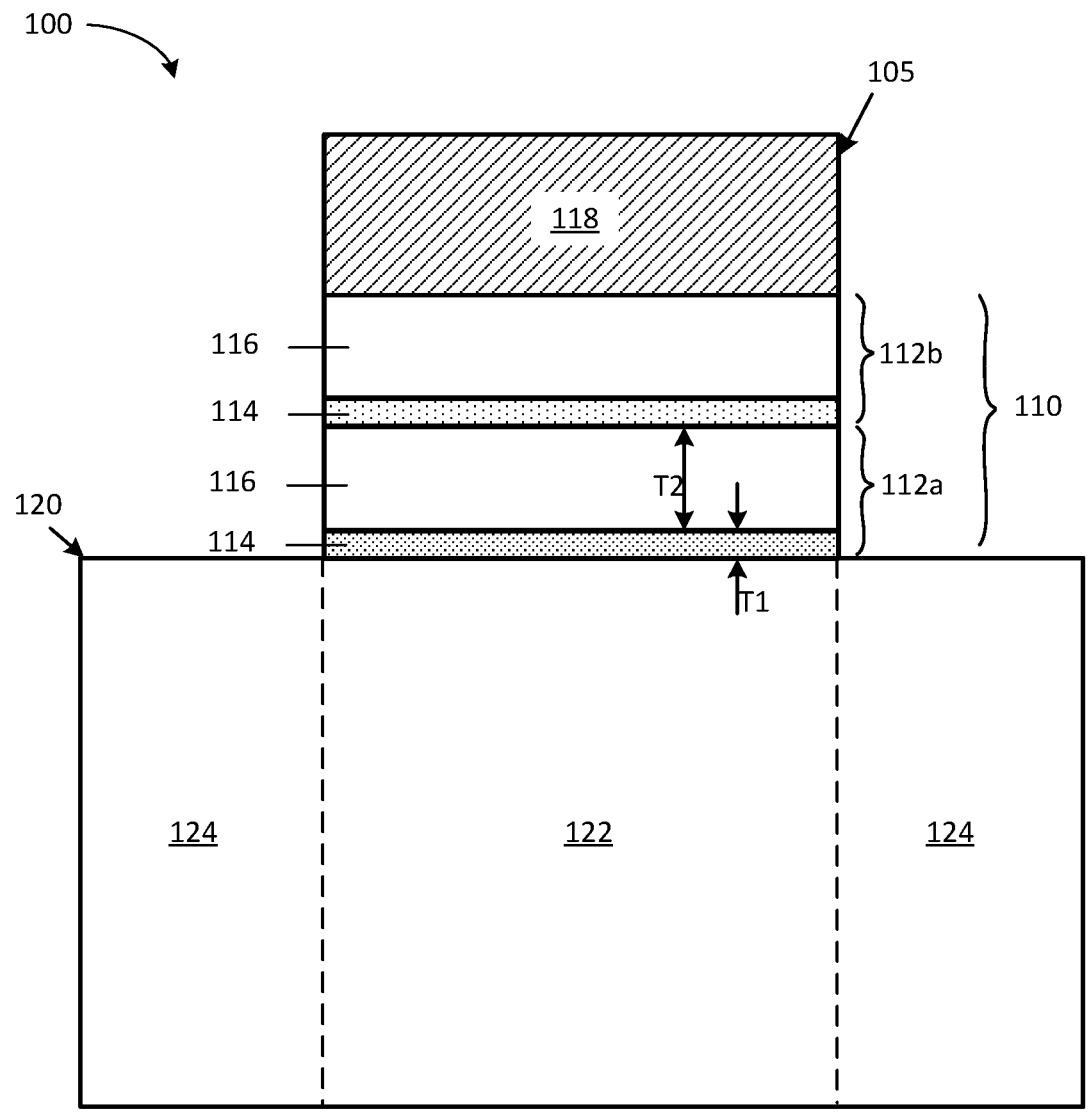
FIG. 1 illustrates a cross-sectional view of a transistor structure showing a gate structure that includes two hybrid stacks of dielectric materials between the gate electrode and the channel region of the semiconductor body, in accordance with an embodiment of the present disclosure.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Structures and methodologies are disclosed for a transistor gate structure having multi-layer gate dielectric, particularly those having a channel of Group III-V material, in accordance with some embodiments. In one embodiment, the gate structure has a plurality of hybrid stacks of dielectric material, the first stack of which is in contact with a body of semiconductor material, such as Group III-V semiconductor material. Each of one or more of the hybrid stacks has a thin layer of low-κ dielectric and a thicker layer of high-κ dielectric on the layer of low-κ dielectric. For example, the low-κ dielectric is aluminum oxide ($Al_2O_3$) and has a thickness of 1 nm or less (e.g., 0.9 nm, 0.3 nm, or 0.2 nm). In some embodiments, the high-κ dielectric is hafnium oxide ($HfO_2$), zirconium oxide ($ZrO_2$), or a combination of these materials. In some embodiments, the layer of high-κ dielectric is a composite layer that includes two compositionally distinct materials, such as a first layer of zirconium oxide and a second layer of hafnium oxide on the first layer. Other high-κ and low-κ dielectric materials can be used, including various oxides and nitrides, for example. In one example, the gate structure has at least two hybrid stacks, and as many as nine or more hybrid stacks. In each stack according to some such embodiments, a ratio of the thickness of the high-κ dielectric to the thickness of the low-κ dielectric is at least 2:1, including at least 3:1, at least 3.5:1, from 3:1 to 5:1, and about 4:1. The gate structure with multiple hybrid stacks of low-κ and high-κ dielectrics can be used with any transistor configurations, including, for example, thin-film transistors, finned transistors, planar transistors, vertical transistors, and nanowire/nanoribbon transistors.

In one example, the low-κ dielectric is a layer of aluminum oxide with a thickness of about 0.9 nm and the high-κ dielectric is a layer of hafnium oxide layer with a thickness of about 3 to 4 nm. In another example, the low-κ dielectric is aluminum oxide with a thickness of about 0.3 nm and the high-κ dielectric is hafnium oxide with a thickness from about 1.1 to 1.3 nm. In some such embodiments, the gate dielectric includes six hybrid stacks of dielectric material. In yet another example, low-κ dielectric is aluminum oxide with a thickness of about 0.2 nm and the high-κ dielectric includes a layer of zirconium oxide with a thickness of about 0.4 nm and a layer of hafnium oxide with a thickness of about 0.6 nm. In some such embodiments, the gate dielectric includes nine hybrid stacks of dielectric material.

In some embodiments, a thin layer of aluminum oxide can be deposited using atomic layer deposition (ALD) or formed as a semi-native oxide layer using a wet oxidation technique (e.g., using $H_2O_2$). By limiting the thickness of each layer of high-κ dielectric, crystallization of the high-κ dielectric is prevented. Crystallization of the high-κ oxide is also reduced or prevented by depositing the high-κ oxide on a thin layer of aluminum oxide or other low-κ dielectric of an amorphous crystal structure. Numerous variations will be apparent in light of this disclosure.

General Overview

Transistors can be made using a variety of active materials, including Group III-V semiconductors. A gate structure is formed in contact with a body of semiconductor material (e.g., a channel region between source and drain regions). The gate structure has a gate dielectric and a gate electrode, where the gate dielectric is between the body of semiconductor material and the gate electrode. The gate dielectric can be formed of a high-κ dielectric material, such as hafnium oxide. To adequately prevent tunneling, the gate dielectric needs to have a sufficient thickness. However, when the high-κ dielectric is deposited on monocrystalline material, it tends to crystallize as the thickness increases. The crystallized high-κ dielectric results in reduced device performance and can occur before the needed thickness is reached.

Therefore, and in accordance with an embodiment of the present disclosure, a gate structure includes a hybrid stack of a low-κ dielectric and a high-κ dielectric. The low-κ dielectric is a thin layer that serves as a buffer of amorphous material between the semiconductor material and the high-κ dielectric. As such, a layer of high-κ dielectric (e.g., an oxide) of improved quality can be deposited on the low-κ dielectric (e.g., an oxide). The high-κ dielectric can have a thickness about four times that of the low-κ dielectric. The hybrid stack of dielectric materials can be repeated two, three, or more times to result in a gate dielectric with thickness sufficient to reduce or prevent tunneling, for example.

Gate structures as variously provided herein can be part of a transistor of any geometry. For example, the transistor can be a FinFET, a thin-film transistor (TFT), or a nanowire transistor. Principles of the gate dielectric in accordance with the present disclosure can be applied to a gate structure in contact with a single face of a semiconductor body (e.g., a top surface), two or more sides (e.g., a tri-gate transistor or FinFET), or gate-all-around transistors (e.g., a nanowire transistor). Some such transistors in turn can be part of an integrated circuit.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Further note that the expression "active material" or "active materials" as used herein simply refers to materials as variously noted herein, and is not intended to imply that the material is currently electrically biased or otherwise in a conductive state where carriers are mobile within the material, as will plainly be apparent and appreciated. For instance, a given active material need not be connected (whether directly or indirectly) to any power source whatsoever to be considered an active material. Nor does the active material need to be in a conducting state to be considered an active material.

Likewise, the use herein of expressions such as "channel region" or "channel portion" or "source region" or "source portion" or "drain region" or "drain portion" simply refers to specific locations of a transistor structure, and is not intended to imply that the transistor itself is currently electrically biased or otherwise in a conductive state where carriers are mobile within the channel region, as will be plainly apparent and appreciated. For instance, a given transistor need not be connected (whether directly or indirectly) to any power source whatsoever to have a channel region.

Materials that are "compositionally different" or "compositionally distinct" as used herein refers to two materials that have different chemical compositions. This compositional difference may be, for instance, by virtue of an element that is in one material but not the other (e.g., SiGe is compositionally different from silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

As used herein, the term "low-κ" refers to a material having a dielectric constant equal to or less than that of silicon dioxide ($SiO_2$), which has a value of 3.9 according to some measurement methods. Examples of low-κ materials include amorphous carbon, aluminum oxide ($Al_2O_3$), spin-on glass, silicon oxycarbides (SiOCH), fluorine-doped $SiO_2$, carbon-doped $SiO_2$, and silsesquioxanes, to provide a few examples. As also used herein, the term "high-κ" refers to materials having a dielectric constant greater than that of silicon dioxide ($SiO_2$). Examples of high-κ dielectric materials include hafnium dioxide ($HfO_2$), zirconium dioxide ($ZrO_2$) and titanium dioxide ($TiO_2$) to provide some examples.

As also used herein, the expression "X includes at least one of A or B" refers to an X that may include, for example, just A only, just B only, or both A and B. To this end, an X that includes at least one of A or B is not to be understood as an X that requires each of A and B, unless expressly stated. For instance, the expression "X includes A and B" refers to an X that expressly includes both A and B. Moreover, this is true for any number of items greater than two, where "at least one" item is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, EDX may indicate, for example, a transistor gate structure having stacks of hybrid dielectric material layers, one of which is a low-κ dielectric and the other of which is a high-κ dielectric. TEM can be useful to show a cross section of the device structure where the gate structure has two or more hybrid dielectric layers between the active material and the gate electrode. Similarly, such tools can be used to detect a ratio of layer thicknesses in the hybrid dielectric layer. For example, the ratio of thickness of the high-κ dielectric to the thickness of low-κ dielectric is from 3:1 to 5:1. In some embodiments, the techniques described herein may be detected based on the benefits derived from their use, which includes transistors with a Group III-V channel material that exhibits a breakdown voltage of at least 7 volts and an operating voltage of at least 500 millivolts.

Architecture

FIG. 1 illustrates a cross-sectional (XZ) view of a transistor structure 100 that includes a gate structure 105 on a layer of semiconductor material 117, in accordance with an embodiment of the present disclosure. The gate structure 105 includes a gate dielectric 110 and a gate electrode 118, where the gate dielectric 110 is between the semiconductor material 120 and the gate electrode 118. The gate electrode 118 can be made of metal or other suitable conductive material. The gate electrode 118 is in contact with and defines a channel region 122 between source and drain regions 119 ("S/D regions") of the layer of semiconductor material 120. The semiconductor material 120 can be a Group III-V material, such as gallium nitride (GaN).

The gate dielectric 110 includes at least two hybrid stacks 112 of dielectric material, each of which has a relatively thin (~1.0 nm thickness) layer of low-κ dielectric 114 and a thicker layer (~3-4 nm) of high-κ dielectric 116. As such the dielectric materials in the hybrid layer stack 112 are compositionally different. The low-κ dielectric material 114 has a first thickness T1 and the high-κ dielectric 116 has a second thickness T2. In one example embodiment, a ratio of thickness T2 of the high-κ dielectric 116 to thickness T1 of the low-κ dielectric 114 is at least 2:1, including at least 2.5:1, at least 3:1, at least 3.5:1, at least 4:1, at least 4.5:1, and at least 5:1. In some embodiments, the ratio T2:T1 is not greater than 6:1, including not greater than 5.5:1, not greater than 5:1, and not greater than 4.5:1. In some embodiments, thickness T2 of the high-κ dielectric material 116 is not greater than 10 nm, including not greater than 8 nm, not greater than 7 nm, not greater than 6 nm, not greater than 5.5 nm, not greater than 5.0 nm, not greater than 4.5 nm, and not greater than 4.0 nm.

The first hybrid stack 112a is formed directly on the layer of semiconductor material 120. For example, the low-κ dielectric 114 is aluminum oxide with a thickness of about 0.9 nm that is formed as a semi-native oxide on gallium nitride (GaN) a body 120 of gallium nitride (GaN) using atomic layer deposition (ALD) or wet oxidation techniques. The low-κ dielectric 114 has a thickness of 2 nm or less, including 1.5 nm or less, 1.0 nm or less, and 0.5 nm or less. In some embodiments, for example, the low-κ dielectric 114 is a single monolayer or up to several monolayers thick. The high-κ dielectric 116 has a thickness T2 of 3-5 nm, for example. In one example, the low-κ dielectric is a layer of aluminum oxide with a thickness of about 0.9 nm and the high-κ dielectric is a layer of hafnium oxide layer with a thickness of about 3 to 4 nm. In another example, the low-κ dielectric 114 is aluminum oxide with a thickness of about 0.3 nm and the high-κ dielectric 116 is hafnium oxide with a thickness from about 1.1 to 1.3 nm. In some such embodiments, the gate dielectric includes four to eight hybrid stacks 112 of dielectric material, such as six hybrid stacks 112.

The second hybrid stack 112b is formed on the first hybrid stack 112. More specifically, the low-κ dielectric 114 of the second hybrid stack 112b is formed on the high-κ dielectric 116 of the first hybrid stack 112a. The high-κ material 116 of the second hybrid stack 112b is formed on the low-κ 114 material of the second hybrid stack 112b. Successive hybrid stacks 112 can be similarly formed.

The embodiment shown in FIG. 1 is representative of a FinFET transistor structure 100. The gate structures 105 in accordance with the present disclosure are not limited to fin-based architectures with the gate structure 105 in contact with the top surface of the fin; gate structure 105 can be used with dual gate, trigate, nanowire or gate-all-around transistors, thin-film transistors, planar transistors, and other geometries, as will be appreciated.

Figure 2:
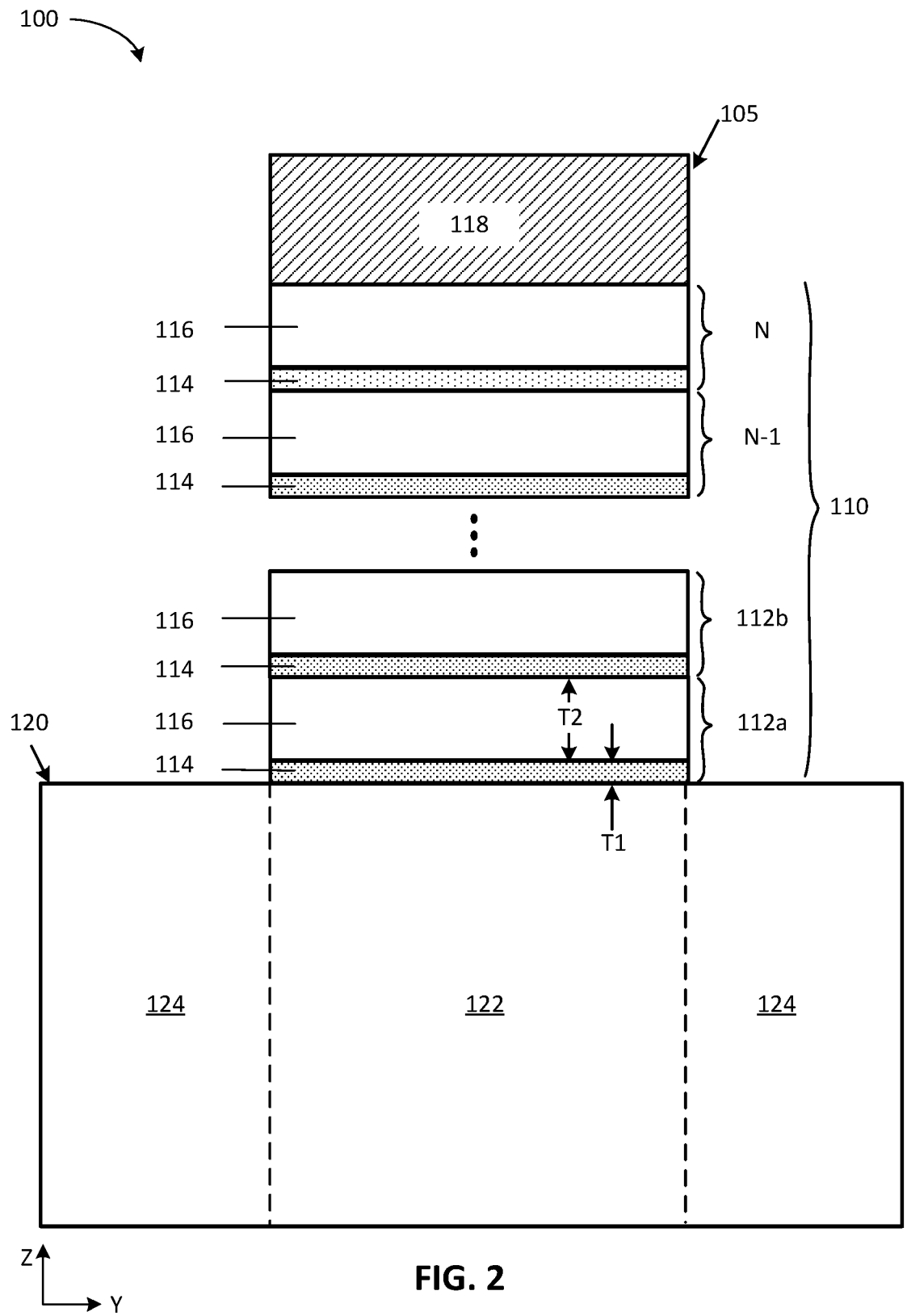
FIG. 2 illustrates a cross-sectional view of a gate structure with a plurality of hybrid stacks of dielectric materials between the gate electrode and a body of semiconductor material, in accordance with an embodiment of the present disclosure.

Referring now to FIG. 2, a cross-sectional view illustrates a transistor structure 100 in accordance with another embodiment of the present disclosure. In this example embodiment, the gate dielectric 110 includes N hybrid stacks 112 of dielectric material. N can be 2 or greater. As discussed above with reference to FIG. 1, each hybrid stack 112 includes a thin layer of low-κ dielectric 114 and a layer of high-κ dielectric 116 formed on the layer of low-κ dielectric 114. The first hybrid stack 112a is formed on the layer of semiconductor material 120 as discussed above. Each additional hybrid stack 112 is formed on the previous hybrid stack 112 with the layer of low-κ dielectric 114 on the preceding layer of high-κ dielectric 116. The gate electrode 118 is formed on the last or Nth layer of high-κ dielectric 116. As also discussed above, thickness T2 of the high-κ dielectric 116 is greater than thickness T1 of the low-κ dielectric 114, such as a ratio of T2:T1 of about 4. In one embodiment, the gate structure 105 includes 4, 6, 8, 10 or more hybrid stacks 112. As a general matter, more hybrid stacks 112 can result in greater device performance. In one example embodiment, the gate structure 105 includes nine hybrid stacks 112 of dielectric material.

In some embodiments, each layer of low-κ dielectric 114 is the same and each layer of high-κ dielectric 116 is the same. In other embodiments, the gate structure 105 may employ two or more compositionally distinct low-κ dielectrics 114 and/or two or more compositionally distinct high-κ dielectrics 116. For example, the low-κ dielectric 114 of the first hybrid stack 112a is aluminum oxide and the low-κ dielectric 114 of the second hybrid stack 112b is zirconia.

Figure 3:
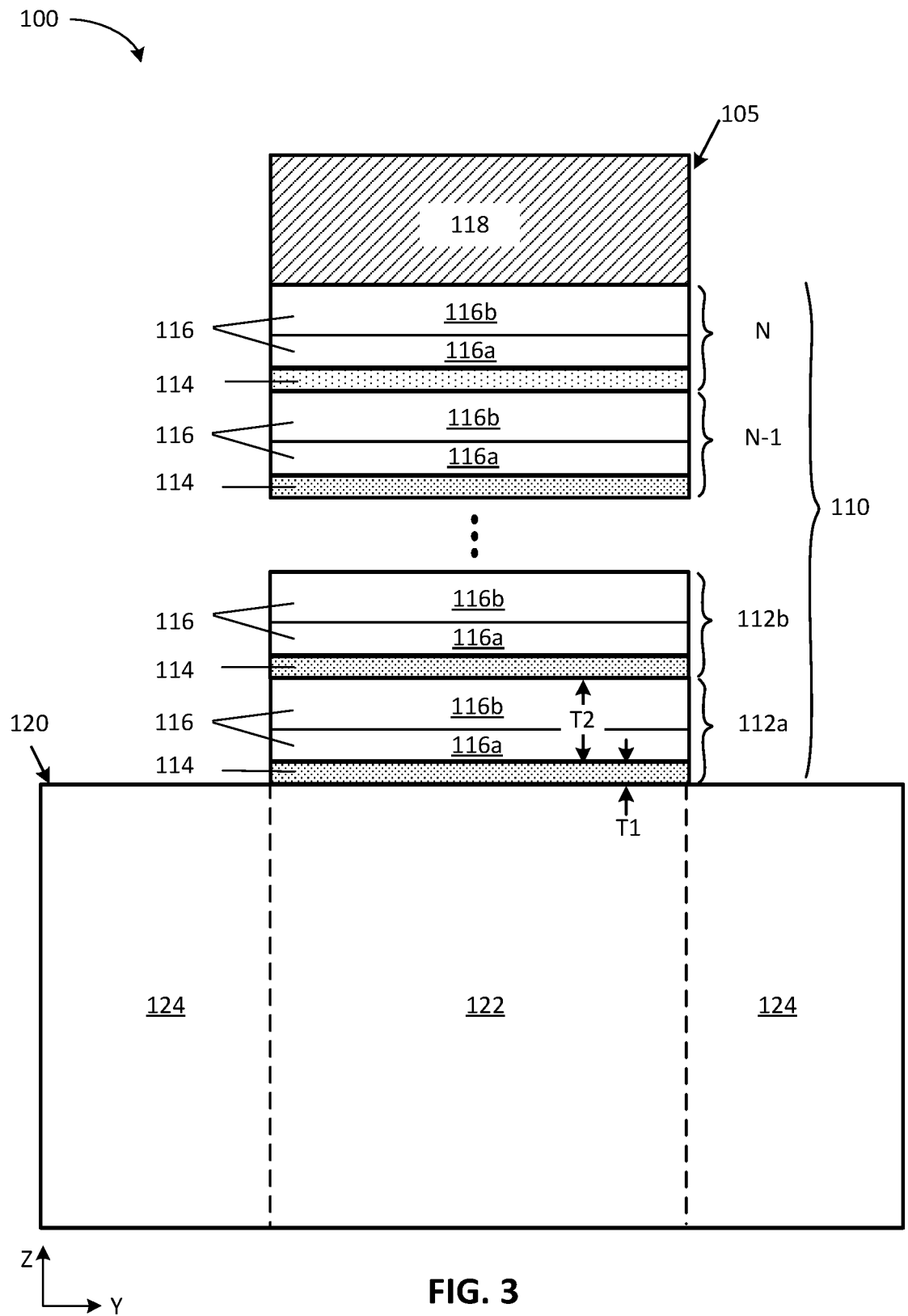
FIG. 3 illustrates a cross-sectional view of a gate structure with a plurality of hybrid stacks of dielectric materials between the gate electrode and a body of semiconductor material, where the high-κ dielectric includes two or more compositionally distinct materials, in accordance with an embodiment of the present disclosure.

Referring now to FIG. 3, a cross-sectional view illustrates a transistor structure 100 in accordance with another embodiment of the present disclosure. In this example embodiment, the gate dielectric 110 includes N hybrid stacks 112 of dielectric material, where N is 2 or greater. As discussed above with reference to FIG. 2, each hybrid stack 112 includes a thin layer of low-κ dielectric 114. The high-κ dielectric 116 is a composite layer that includes two or more layers of compositionally distinct high-κ material, in this example case. For example, the low-κ dielectric is aluminum oxide ($Al_2O_3$) with a thickness of about 0.2 nm. The high-κ dielectric includes a first layer 116a of zirconium oxide with a thickness of about 0.4 nm (about twice the thickness of the $Al_2O_3$) and a second layer 116b of hafnium oxide with a thickness of about 0.6 nm (about three times the thickness of the $Al_2O_3$). In this example, the combined thickness of the first and second layers 116a, 116b of high-κ dielectric material is about 5 times that of the low-κ dielectric 114. The combined thickness of the high-κ dielectric 116, including first and second layers 116a, 116b, is at least three times that of the low-κ dielectric 114, including at least 3.5 times, at least 4 times, at least 5 times, from 3.5 to 5 times, from 3 to 6 times, and from 4 to 6 times. In one example embodiment, the low-κ dielectric 114 is aluminum oxide with a thickness of about 0.2 nm and the high-κ dielectric 116 includes a first layer 116a of zirconium oxide with a thickness of about 0.4 nm and a second layer 116b of hafnium oxide with a thickness of about 0.6 nm. In some such embodiments, the gate dielectric includes six to twelve hybrid stacks 112 of dielectric material, such as nine hybrid stacks 112. As with embodiments discussed above, the first hybrid stack 112a is formed on the layer of semiconductor material 120 and each additional hybrid stack 112 is formed on the previous hybrid stack 112 with the layer of low-κ dielectric 114 on the preceding layer of high-κ dielectric 116. The gate electrode 118 is formed on the last or Nth layer of high-κ dielectric 116. The Nth layer may also be referred to as the outermost layer since each layer is deposited over a preceding layer. As also discussed above, thickness T2 of the high-κ dielectric 116 is greater than thickness T1 of the low-κ dielectric 114, such as a ratio of T2:T1 from 3:1 to 5:1. In one embodiment, the gate structure 105 includes 4, 6, 8, 10 or more hybrid stacks 112. As a general matter, more hybrid stacks 112 can result in greater device performance. In one example embodiment, the gate structure 105 includes nine hybrid stacks 112 of dielectric material.

In some embodiments, each layer of low-κ dielectric 114 is the same and each layer of high-κ dielectric 116 is the same. In other embodiments, the gate structure 105 may employ two or more compositionally distinct low-κ dielectrics 114 and/or two or more compositionally distinct high-κ dielectrics 116. For example, the low-κ dielectric 114 of the first hybrid stack 112a is aluminum oxide and the low-κ dielectric 114 of the second hybrid stack 112b is zirconia.

Figure 4:
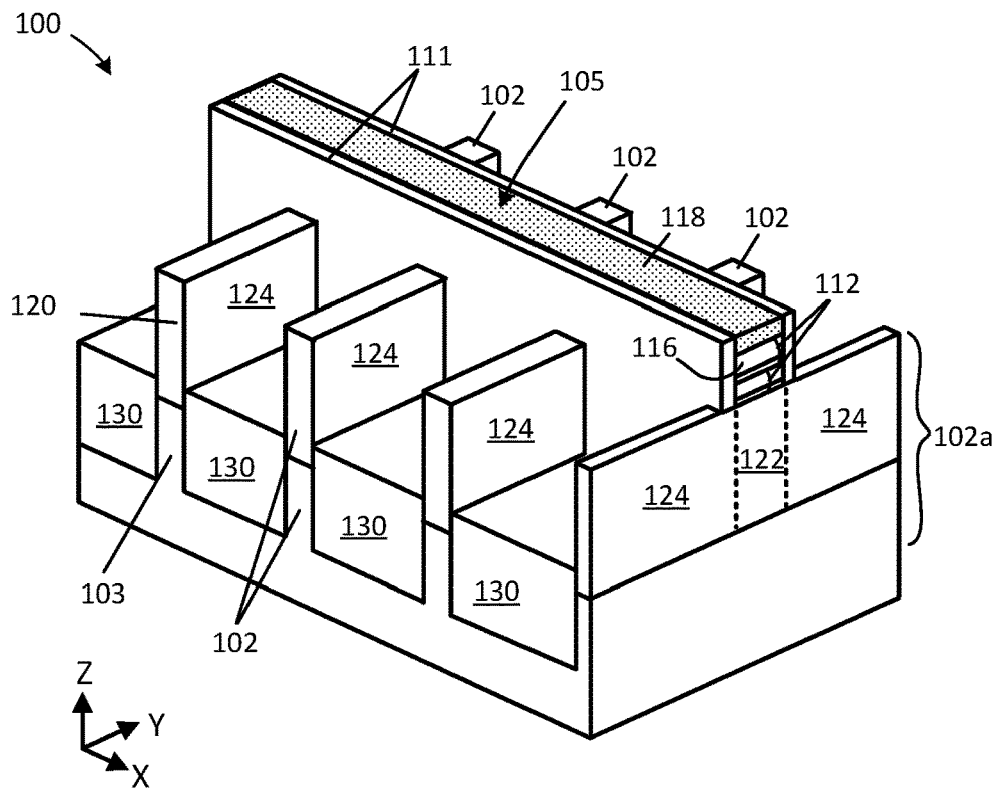
FIG. 4 illustrates a perspective view showing an example gate structure on fins of semiconductor material with the structure sectioned along a Y-Z plane through one of the fins, in accordance with an embodiment of the present disclosure.

FIG. 4 illustrates a perspective cross-sectional view taken along a Y-Z plane along a fin 102 of a FinFET transistor structure 100, in accordance with an embodiment of the present disclosure. In this example, the transistor structure 100 includes four fins 102 and a gate structure 105 that includes hybrid layer stacks 112 of dielectric material and configured with a trigate configuration. Each fin 102 includes a subfin 103 and a body 120 of semiconductor material on top of the subfin 103. The body 120 of semiconductor material includes source/drain regions 124 on opposite lateral sides of the gate structure 105. A channel region 122 is between the S/D regions 124 and below the gate structure 105. Gate spacers 111 are on opposite faces of the gate structure 105. The gate structure 105 is formed over each body 120 and on top of a layer of interlayer dielectric (ILD) 130. The hybrid stacks 112 of dielectric material can be seen between the gate spacers 111 on top of the sectioned fin 102a. A metal gate electrode 118 is in contact with the high-κ dielectric 116 of the outermost layer stack 112. The gate structure 105 a gate dielectric with a plurality of hybrid stacks 112 of dielectric material, various embodiments of which are discussed above.

Figure 5:
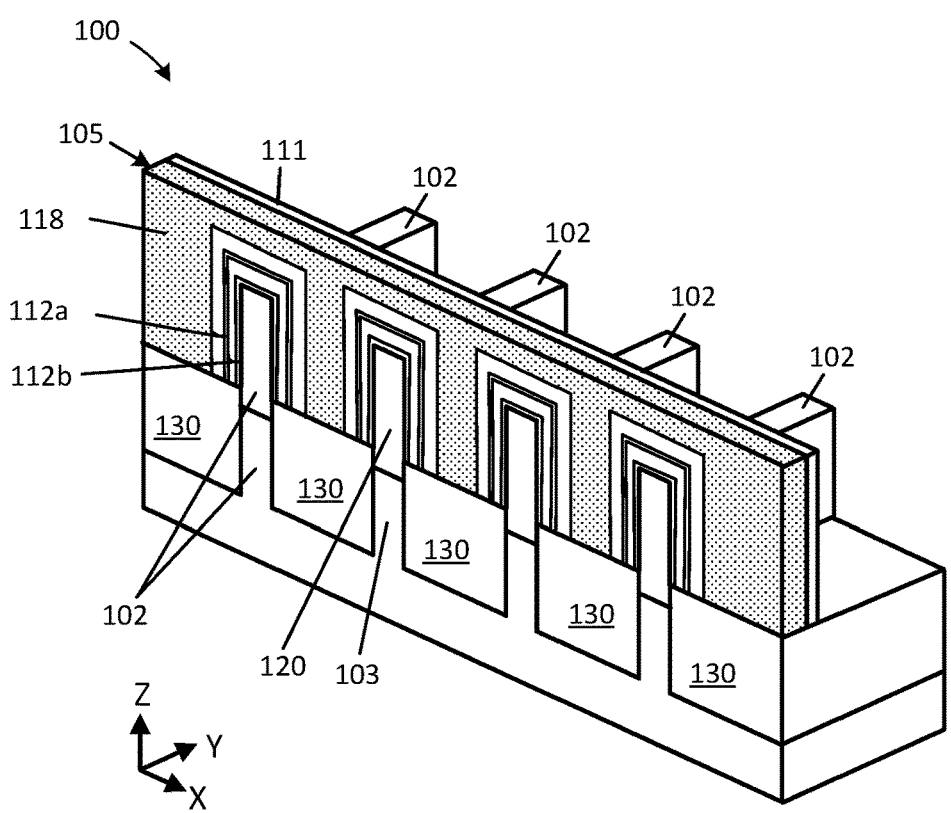
FIG. 5 illustrates a perspective sectional view a gate structure on fins of semiconductor material, the gate structure sectioned along an X-Z plane through the gate structure to show hybrid stacks of dielectric material between the fin and the gate electrode, in accordance with an embodiment of the present disclosure.

FIG. 5 illustrates a perspective cross-sectional view of the embodiment of FIG. 3 taken along a X-Z plane through the gate structure 105. ILD material 130 occupies the space between the lower portion of each fin 102, which may include the subfin 103 and part of the body 120. The gate structure 105 includes a first hybrid stack 112a of dielectric material in contact with each fin 102 and a second hybrid stack 112b of dielectric material in contact with the first hybrid stack 112a. The gate electrode 118 (e.g., metal) is formed over the hybrid layer stacks 112.

Although the body 120 of semiconductor material in each fin 102 is illustrated in FIGS. 4-5 as a single continuous layer that includes the S/D regions 124 and the channel region 122, each S/D region 124 may include replacement S/D material, for example. Also, while only two hybrid stacks 112 of dielectric material are shown, more hybrid stacks 112 can be used. Further, while each hybrid stack 112 is illustrated as having a single low-κ dielectric and a single high-κ dielectric, each hybrid stack 112 can include more than one layer of high-κ dielectric as discussed above. Numerous variations and embodiments will be apparent in light of the present disclosure.

Fabrication Methodologies

Figure 6:
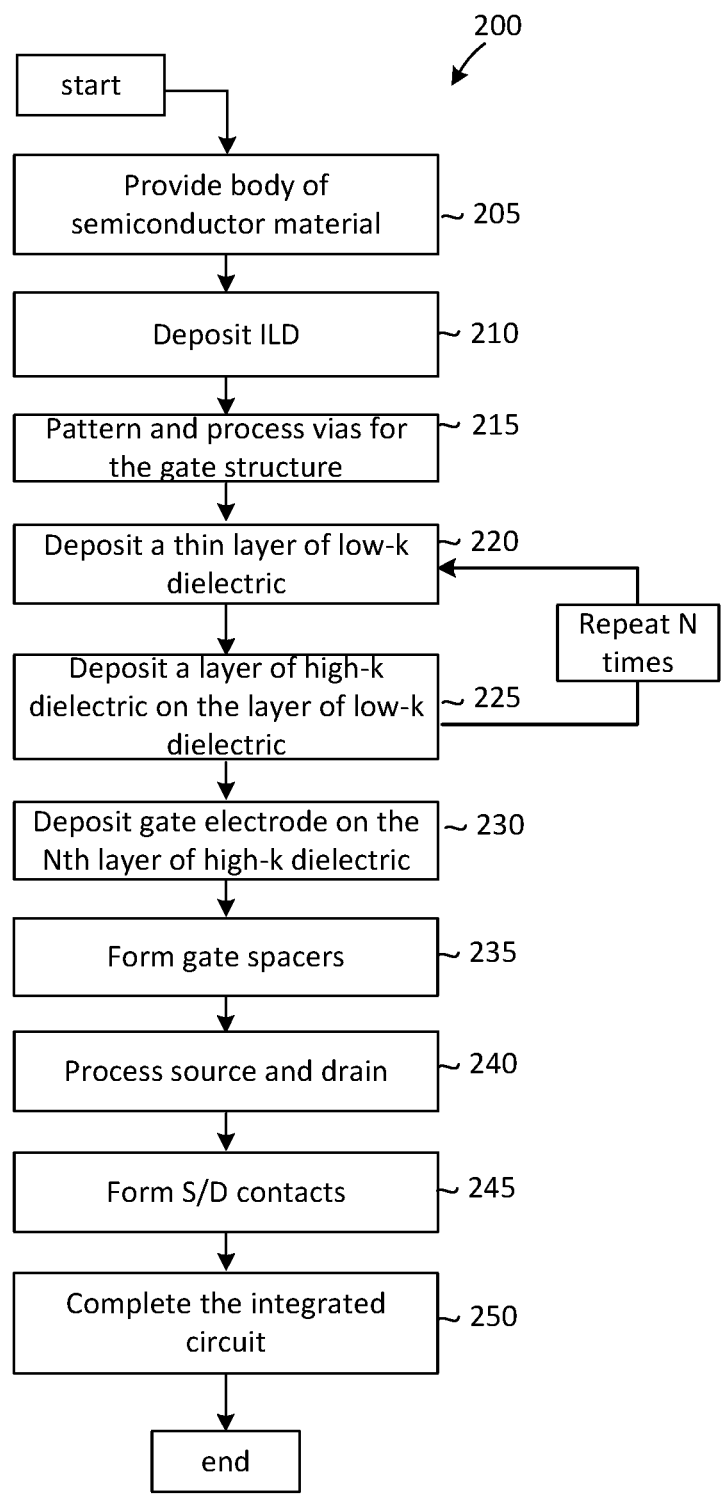
FIG. 6 illustrates a process flow diagram for a method of forming a transistor gate structure, in accordance with an embodiment of the present disclosure.

Referring now to FIG. 6, a flow chart illustrates a process flow in a method 200 of forming a transistor gate structure, in accordance with some embodiments. Method 200 is discussed in the context of a FinFET device. However, method 200 can alternately be performed for a thin-film transistor, nanowire transistor, nanoribbon transistor, nanosheet transistor, or other device geometry utilizing a semiconductor material, as will be appreciated.

In general, method 200 can be performed using any suitable semiconductor fabrication techniques, including deposition, photolithography, wet or dry chemical etching processes, chemical mechanical polishing, deposition or epitaxial growth processes (e.g., CVD, PVD, ALD, VPE, MBE, LPE), melt regrowth, and/or any other suitable processing, as will be appreciated. The components of gate structure 100 can be part of a backend process, such as the back end of line (BEOL) process of a semiconductor integrated circuit. As such, the components of TFT 100 can be fabricated as part of, or concurrently with, the metal interconnection layers of a semiconductor fabrication process. In example embodiments, fabrication of the components of gate structure 100 can be part of the metal (interconnect) layer of a BEOL process. In another embodiment, the components of gate structure 100 are fabricated on a substrate as part of a front end of line (FEOL) process.

Method 200 begins with providing 205 a body of semiconductor material. The body can be selected from many geometries, including a fin, a mesa, a nanowire, a nanoribbon, or a nanosheet, to provide some examples. For example, the body can be configured for a planar transistor structure (e.g., a thin-film transistor), a three-dimensional transistor (e.g., a FinFET or nanowire transistor), or other structure. As a general matter, the body of semiconductor material is or includes a region of semiconductor material between a source region and a drain region. The body can be n-type or p-type semiconductor material. In one embodiment, the body is monocrystalline Group III-V semiconductor material. In one specific embodiment, the body is gallium nitride (GaN). In other embodiments, the body is indium gallium nitride (InGaN), gallium arsenide (GaAs), indium gallium arsenide (InGaAs), indium phosphide (InP), or other Group III-V materials.

In yet other embodiments, the body is a Group IV semiconductor or a transition metal dichalcogenide (TMD). Examples of Group IV materials include silicon (Si), silicon carbide (SiC), germanium (Ge), and silicon germanium (SiGe). TMDs have a general formula of $M_aX_b$, where a and b are from 0-10. The chalcogen atom X is selected from sulfur (S), selenium (Se), and tellurium (Te) and the metal atom M is selected from titanium (Ti), zirconium (Zr), silver (Ag), iron (Fe), zinc (Zn), osmium (Os), vanadium (V), manganese (Mn), gold (Au), cadmium (Cd), mercury (Hg), niobium (Nb), technetium (Tc), tantalum (Ta), hafnium (Hf), cobalt (Co), ruthenium (Ru), chromium (Cr), copper (Cu), palladium (Pd), rhodium (Rh), nickel (Ni), molybdenum (Mo), tungsten (W), iridium (Ir), rhenium (Re), and platinum (Pt). Examples of particular TMDs have a formula of $MX_2$ and include $MoS_2$, $WS_2$, $MoSe_2$, $WSe_2$, $WTe_2$, and $MoTe_2$.

The body of semiconductor material may be formed from a blanket layer or bulk semiconductor material in some embodiments. In one example, mesas or fins are defined by etching bulk semiconductor material or etching a blanket layer of monocrystalline semiconductor material that is grown on a substrate. In other embodiments, the body can be formed on a substrate of semiconductor material or insulating material. In another example, fins of gallium nitride are formed on a substrate of gallium. In one embodiment, forming a body of semiconductor material (e.g., a fin) may be performed, for example, using photolithography techniques that include depositing a blanket layer of semiconductor material, masking certain regions corresponding to fins, and then etching the surrounding material to define fins of semiconductor material. The etching can be any suitable wet or dry etch process, or combination of such processes. In one embodiment, an anisotropic etch is used. In some embodiments, a combination of anisotropic etch and isotropic etch processes may be used. For example, 70-80% the etch is performed with an anisotropic etch process followed by an isotropic etch process for the remainder of the etch. Other variations will be appreciated in light of the present disclosure. In other embodiments, fins can be formed by first forming trenches in an interlayer dielectric (ILD) material by lithography and etching, followed by depositing semiconductor material in the trenches. In some embodiments, the ILD material can be aluminum oxide ($Al_2O_3$), silicon nitride ($Si_3N_4$), silicon dioxide ($SiO_2$), carbon-doped silicon dioxide ($SiO_2$:C), to name a few examples.

In some embodiments, multiple different bodies 120 of semiconductor material can be deposited or formed on different areas of the substrate, such as for CMOS applications. For instance, a first body 120 may be formed on a first area of the substrate to be used for one or more PMOS devices and a second body 120 may be formed on a second area of the substrate to be used for one or more NMOS devices. By selecting the substrate (or a buffer layer thereon) to have the desired properties (e.g., lattice constant), multiple different bodies 120 of semiconductor material can be formed. For instance, in some such embodiments, the first body may include a n-type group III-V or group IV material and a second body may include a p-type group III-V or group IV material.

After forming the body, method 200 continues with depositing 205 a layer of interlayer dielectric (ILD) over the body 120 of semiconductor material, followed by planarizing the structure using chemical-mechanical polishing, in accordance with an embodiment.

Method 200 continues with defining 215 a recess in the ILD material for subsequent processing of the gate structure 105. Lithography and etch processing may be used to define 215 the recess, as will be appreciated. In one embodiment, an anisotropic etch is used to define the recess in a location corresponding to the channel region 122 of the body 120. When the body 120 is a fin, for example, the recess exposes a portion of the fin, including a top surface and sidewalls that will enable the gate structure 105 to contact the fin along three sides (i.e., a trigate configuration). For example, the upper portion of the fin is exposed between source and drain regions 124. When the body 120 is a nanowire, for example, the recess exposes the nanowire(s) between source and drain regions 124.

Method 200 continues with depositing 220 a layer of low-κ dielectric 114 on the exposed region of the body 120. In one example, the low-κ dielectric is a semi-native oxide of aluminum oxide ($Al_2O_3$) formed on the body 120 of semiconductor material. In some embodiments, the low-κ dielectric 114 is formed using a wet oxidation process with hydrogen peroxide ($H_2O_2$). In another embodiment, the low-κ dielectric 114 is formed using atomic layer deposition (ALD). The low-κ dielectric 114 is deposited 220 or formed conformally with a thickness less than 2 nm, including less than 1.5 nm, less than 1.0 nm, or less than 0.5 nm. In one specific embodiment, the low-κ dielectric 114 is $Al_2O_3$ with a thickness of about 0.9 nm. In other embodiments, the thickness of the low-κ dielectric 114 is 0.2 nm or 0.3 nm. The low-κ dielectric has a dielectric constant that is equal to or less than 3.9.

Method 200 continues with depositing 225 one or more layer of high-κ dielectric 116 on the layer of low-κ dielectric 114. In some embodiments, the high-κ dielectric 116 is an oxide, such as hafnium oxide ($HfO_2$) or zirconium oxide ($ZrO_2$). Other suitable high-κ dielectric materials can be used. The high-κ dielectric 116 is deposited with a thickness that is at least as great as that of the low-κ dielectric, including at least 2 times, at least 2.5 times, at least 3 times, at least 3.5 times, at least 4 times, and at least 4.5 times as thick. For example, the high-κ dielectric 116 has a thickness from about 3.5 to 4 nm. The high-κ dielectric 116 has a dielectric constant greater than 3.9. In some embodiments, the high-κ dielectric 116 includes a first layer 116a and a second layer 116b of compositionally distinct dielectric materials. For example, the first layer 116a is zirconium oxide and the second layer is hafnium oxide. In some such embodiments, the thickness of each of the first layer 116a and second layer 116b is two to three times that of the low-κ dielectric 114, where the combined thickness of the first and second layers 116a, 116b is four to five times that of the low-κ dielectric 114, for example.

Processes 220 and 225 together define one hybrid layer 112 of dielectric material. Processes 220 and 225 are a cycle that is repeated N times to define N hybrid layers 112 of dielectric material. In some embodiments, each hybrid layer 112 of dielectric materials has a thickness in a range from 2 nm to 10 nm, including 4-7 nm. In general, more hybrid layers 112 of dielectric material results in increased threshold voltage, as will be appreciated. The cycle of processes 220 and 225 can be performed two, three, four, five six, seven, eight, nine, ten, eleven, twelve, or more times. In one specific embodiment, the low-κ dielectric is $Al_2O_3$ with a thickness of about 0.9 nm, the high-κ dielectric 116 is $HfO_2$ with a thickness of about 3.5 to 4 nm, and the cycle is performed nine times. In each cycle, the same or different materials can be used. Numerous variations and embodiments will be apparent in light of the present disclosure.

Method 200 continues with depositing 230 the gate electrode 118 in contact with the Nth high-κ dielectric 116. The gate electrode 118 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

Method 200 continues with forming 235 gate spacers 111 on opposite sides of the gate structure 105, which includes the hybrid stacks 112 of gate dielectric and the gate electrode 118. The gate spacers 111 may include any suitable material, such as any suitable electrical insulator, dielectric, oxide (e.g., silicon oxide), and/or nitride (e.g., silicon nitride) material, as will be apparent in light of this disclosure. In one embodiment, the gate spacers 111 are formed of silicon nitride ($Si_3N_4$). Note that in some embodiments, a hardmask may be formed over the gate structure 105 to protect the gate electrode 118 during subsequent processing, for example. In some embodiments, the hardmask is formed on top of the gate electrode 118.

Method 200 continues with processing 240 the source and drain regions 124 using any suitable techniques, in accordance with an embodiment of the present disclosure. For example, processing 240 the source and drain can be performed by recessing at least a portion of the exposed source and drain portion 124 of the body 120 of semiconductor material. In some embodiments, all of the body 120 in the source and drain regions 124 is removed by etch processing, in addition to some amount of the substrate or buffer material below the body 120 as may be the case. In other embodiments, the etch process stops short of completely removing the material of the source and drain regions 124, leaving behind a stub or residual portion of the body 120 in those locations. The resulting structure may be masked as needed for deposition or growth of replacement source/drain material. In other embodiments, the exposed source/drain regions 124 of the fins need not be completely removed; instead, the material at the source/drain regions 124 is converted to final source/drain material by doping, implantation, and/or cladding with a source/drain material or other suitable processing, for example.

Replacement S/D material may be grown using any suitable techniques, such as vapor-phase epitaxy (VPE), molecular beam epitaxy (MBE), or liquid-phase epitaxy (LPE), for example. Material of the source and drain regions 124 can be epitaxially grown laterally from the channel region 122 exposed at the gate spacer 111. For example, single-crystal material grows hemispherically outward from the exposed ends of the channel region 122.

In some embodiments, the source and drain may be formed one polarity at a time, such as processing one of n-type and p-type S/D, and then processing the other of the n-type and p-type S/D. In some embodiments, the source and drain may include any suitable doping scheme, such as including suitable n-type and/or p-type dopant (e.g., in a concentration in the range of 1E16 to 1E22 atoms per cubic cm). However, in some embodiments, at least one source or drain may be undoped/intrinsic or relatively minimally doped, such as including a dopant concentration of less than 1E16 atoms per cubic cm, for example.

In some embodiments, one or more of the S/D regions 124 may have a multilayer structure including two or more distinct layers, for example. In some such embodiments, one or more of the layers of the S/D regions 124 may include grading (e.g., increasing and/or decreasing) the content/ concentration of one or more materials in some or all of the S/D region 124. For instance, in some embodiments, it may be desired to gradually increase the concentration of a given dopant or element as a given S/D region 124 is formed, such as to reduce dopant diffusion. For example, the S/D region 124 has a relatively lower doping concentration near the channel region 122 and a relatively higher doping concentration near the corresponding S/D contact for improved contact resistance.

Method 200 continues with forming 245 source/drain contacts. The source and drain contacts can be formed 245 using any suitable techniques, such as forming contact trenches in an ILD layer deposited over the respective source/drain regions 124, followed by depositing metal or metal alloy (or other suitable electrically conductive material) in the contact trenches. In some embodiments, forming 245 source/drain contacts may include silicidation, germanidation, III-V-idation, and/or annealing processes, for example. In some embodiments, the source and drain contacts may include aluminum or tungsten, although any suitable conductive metal or alloy can be used, such as silver, nickel-platinum, or nickel-aluminum, for example. In some embodiments, one or more of the source and drain contacts may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used.

In some embodiments, additional layers may be present in the source and drain contacts, such as adhesion layers (e.g., titanium nitride) and/or liner or barrier layers (e.g., tantalum nitride), if so desired. In some embodiments, a contact resistance-reducing layer may be present between a given source or drain region 124 and its corresponding source or drain contact, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance-reducing layer may include semiconductor material and/or impurity dopants based on the included material and/or dopant concentration of the corresponding source or drain region 124, for example.

Method 200 continues by completing 250 a general integrated circuit (IC) as desired, in accordance with some embodiments. Such additional processing to complete an IC may include back-end or back-end-of-line (BEOL) processing to form one or more metallization layers and/or interconnect in contact with the transistor devices formed, for example. Any other suitable processing may be performed, as will be apparent in light of this disclosure.

Note that the processes in method 00 are shown in a particular order for ease of description.

However, one or more of the processes may be performed in a different order or may not be performed at all (and thus be optional), in accordance with some embodiments. Although method 200 is discussed above as an example series of processes, it is to be understood that there is no required order to the processes unless specifically indicated. For example, S/D processing can be performed before or after gate processing. Also, processes described above are not exhaustive and processing may include additional processing, such as lithography processing, deposition of ILD layers, and other such processes, as will be appreciated.

Further, method 200 may include processing for dummy structures, such as a dummy gate structure, dummy S/D regions 124, and other intermediate processing. Method 200 has numerous variations as will be apparent.

Example System

Figure 7:
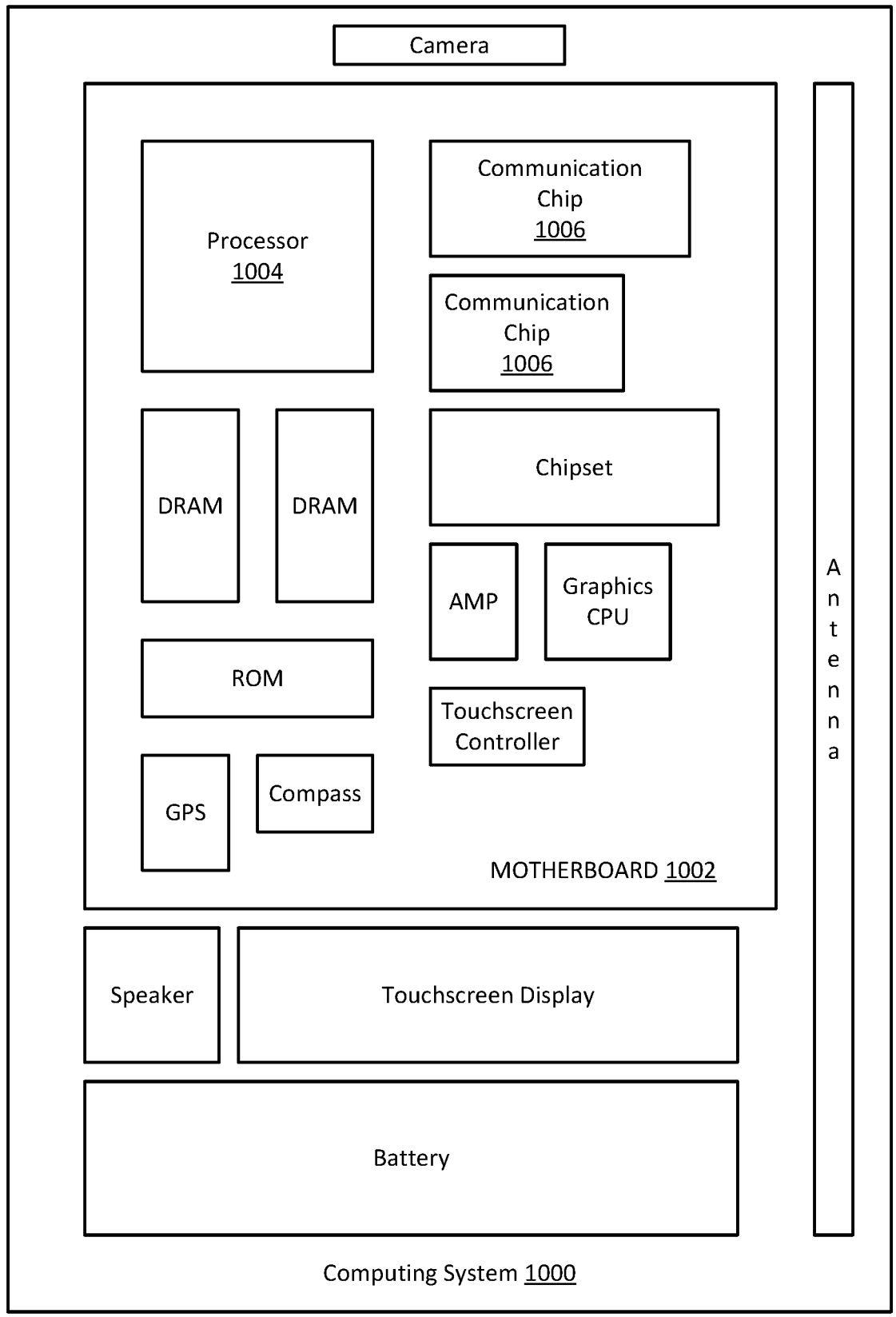
FIG. 7 illustrates an example computing system with an integrated circuit implementing transistor structures disclosed herein, in accordance with an embodiment of the present disclosure.

FIG. 7 illustrates a computing system 1000 implemented with the integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including embedded memory, such as an eDRAM incorporating recessed thin-channel TFTs as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., dynamic random access memory (DRAM) or embedded dynamic random access memory (eDRAM)), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more memory cells, one or more memory cell arrays) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., one or more memory cells) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., one or more memory cells) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more memory cells) formed using the disclosed techniques, as variously described herein.

Further Example Embodiments

The following examples pertain to further embodiments, from which numerous permutations and configurations will be apparent.

Example 1 is an integrated circuit comprising a source region; a drain region; and a portion of semiconductor material between the source region and the drain region; a gate structure in contact with the portion of semiconductor material between the source region and the drain region, the gate structure comprising a gate dielectric structure on the portion of semiconductor material and including N hybrid stacks of dielectric material, each of first and second hybrid stacks included in the N hybrid stacks comprising a layer of low-κ dielectric having a thickness, and a layer of high-κ dielectric on the layer of low-κ dielectric, wherein the layer of high-κ dielectric has a thickness at least two times the thickness of the layer of low-κ dielectric; wherein N is 2 or more; and a gate electrode in contact with the gate dielectric structure.

Example 2 includes the subject matter of Example 1, wherein the first hybrid stack of the N hybrid stacks has a first low-κ dielectric in contact with the portion and a first high-κ dielectric on the first low-κ dielectric.

Example 3 includes the subject matter of Examples 1 or 2, wherein the portion comprises a Group III-V semiconductor.

Example 4 includes the subject matter of Example 3, wherein the portion comprises gallium and nitrogen.

Example 5 includes the subject matter of any of Examples 1-4, wherein first low-κ dielectric comprises aluminum and oxygen.

Example 6 includes the subject matter of any of Examples 1-5, wherein the first low-κ dielectric has a thickness no greater than 1.5 nm.

Example 7 includes the subject matter of Example 6, wherein the thickness no greater than 1 nm.

Example 8 includes the subject matter of Example 6, wherein the thickness is no greater than 0.5 nm.

Example 9 includes the subject matter of any of Examples 1-8, wherein the layer of high-κ dielectric is a composite layer that includes a first high-κ layer and a second high-κ layer, the second high-κ layer being compositionally distinct from the first high-κ layer.

Example 10 includes the subject matter of Example 9, wherein the first high-κ layer comprises zirconium and oxygen, and the second high-κ layer comprises hafnium and oxygen.

Example 11 includes the subject matter of Example 10, wherein a thickness of the first high-κ layer is less than 1 nm and a thickness of the second high-κ layer is less than 1 nm.

Example 12 includes the subject matter of Example 9, wherein the first high-κ dielectric is a first oxide and the second high-κ dielectric is a second oxide.

Example 13 includes the subject matter of Example 12, wherein the first oxide is compositionally different from the second oxide.

Example 14 includes the subject matter of Example 12 or 13, wherein at least one of the first high-κ dielectric and the second high-κ dielectric comprises hafnium and oxygen.

Example 15 includes the subject matter of Example 14, wherein the second high-κ dielectric comprises zirconium and oxygen.

Example 16 includes the subject matter of any of Examples 1-15, wherein a thickness of the layer of high-κ dielectric is at least three times a thickness of the layer of low-κ dielectric.

Example 17 includes the subject matter of any of Examples 1-16, wherein a thickness of the layer of high-κ dielectric is three to five times thicker than the layer of low-κ dielectric.

Example 18 includes the subject matter of any of Examples 1-17, wherein N is at least 5 and each of the at least 5 hybrid stacks includes the layer of low-κ dielectric and the layer of high-κ dielectric.

Example 19 includes the subject matter of Example 18, wherein N is at least 8 and each of the at least 8 hybrid stacks includes the layer of low-κ dielectric and the layer of high-κ dielectric.

Example 20 includes the subject matter of any of Examples 1-18, wherein the N hybrid stacks have a combined thickness of at least 10 nm between the body and the gate electrode.

Example 21 includes the subject matter of any of Examples 1-20, wherein source region and the drain region are compositionally distinct from the portion of semiconductor material between the source region and the drain region.

Example 22 includes the subject matter of any of Examples 1-20, wherein the source region, the drain region, and the portion of semiconductor material between the source region and the drain region are a continuous body of semiconductor material.

Example 23 includes the subject matter of any of Examples 1-22 comprising at least one transistor having a breakdown voltage of at least 7 volts and an operating voltage of at least 500 millivolts.

Example 24 includes the subject matter of Example 23, wherein the operating voltage is at least 600 millivolts.

Example 25 includes the subject matter of any of Examples 1-24, wherein the gate electrode has a gate-all-around configuration.

Example 26 includes the subject matter of any of Examples 1-24, wherein the gate electrode has a tri-gate configuration.

Example 27 includes the subject matter of any of Examples 1-24, wherein the body has a shape selected from a fin, a nanowire, a nanoribbon, a nanosheet, or a mesa.

Example 28 is an integrated circuit comprising a body of semiconductor material; a source region contacting a first surface of the body; a drain region contacting a second surface of the body; and a gate structure including a gate dielectric and a gate electrode, the gate dielectric in contact with the body of semiconductor material and including first and second hybrid stacks of dielectric material, each of the first and second hybrid stacks including a layer of low-κ dielectric and a layer of high-κ dielectric on the layer of low-κ dielectric, and the gate electrode in contact with the layer of high-κ dielectric of an uppermost hybrid stack included in the two or more hybrid stacks of dielectric material, wherein a ratio of thicknesses of the layer of high-κ dielectric to the layer of low-κ dielectric is at least 3:1 for one or more of the hybrid stacks.

Example 29 includes the subject matter of Example 28, wherein the layer of high-κ dielectric is a composite layer that includes a first layer of high-κ dielectric and a second layer of high-κ dielectric on the first layer of high-κ dielectric, the first layer of high-κ dielectric being compositionally distinct from the second layer of high-κ dielectric.

Example 30 includes the subject matter of Example 29, wherein the first layer of high-κ dielectric comprises zirconium and oxygen and the second layer of high-κ dielectric comprises hafnium and oxygen.

Example 31 includes the subject matter of any of Examples 29 or 30, wherein a thickness of the first layer of high-κ dielectric is less than 0.5 nm and a thickness of the second layer of high-κ dielectric is less than 1 nm.

Example 32 includes the subject matter of any of Examples 28-31, wherein the gate dielectric includes at least six hybrid stacks of dielectric material.

Example 33 includes the subject matter of any of Examples 28-32, wherein the body comprises a monocrystalline Group III-V semiconductor.

Example 34 includes the subject matter of Example 30, wherein the body of semiconductor material comprises gallium and nitrogen.

Example 35 includes the subject matter of any of Examples 28-34, wherein the low-κ dielectric comprises aluminum and oxygen and has a thickness no greater than 0.5 nm.

Example 36 includes the subject matter of Example 32, wherein the high-κ dielectric comprises hafnium and oxygen and has a thickness from 1 nm to 1.5 nm.

Example 37 includes the subject matter of any of Examples 28-36, wherein the gate dielectric includes at least nine hybrid stacks of dielectric material.

Example 38 includes the subject matter of any of Examples 28-37 comprising at least one transistor having a breakdown voltage of at least 7 volts and an operating voltage of at least 500 millivolts.

Example 39 includes the subject matter of Example 38, wherein the operating voltage is at least 600 millivolts.

Example 40 includes the subject matter of any of Examples 28-39, wherein the body of semiconductor material includes one or more nanowires and/or nanoribbons, and the gate structure wraps around the one or more nanowires and/or nanoribbons Example 41 includes the subject matter of any of Examples 28-39, wherein the gate electrode has a tri-gate configuration.

Example 42 includes the subject matter of any of Examples 28-39, wherein the body has a shape selected from a fin, a nanowire, a nanoribbon, a nanosheet, or a mesa.

Example 43 is a method of forming a transistor gate structure, the method comprising providing a body of semiconductor material; depositing a gate dielectric structure on the body of semiconductor material, the gate dielectric structure including N hybrid stacks of dielectric material, wherein N is 2 or more and each of the N hybrid stacks comprises depositing a layer of low-κ dielectric and a layer of high-κ dielectric on the layer of low-κ dielectric, wherein the layer of high-κ dielectric has a thickness at least two times the thickness of the layer of low-κ dielectric; and depositing a gate electrode on the high-κ dielectric of an Nth hybrid stack of the N hybrid stacks of dielectric material.

Example 44 includes the subject matter of Example 43 and further comprises processing a source on a first end of the body; and processing a drain on a second end of the body, the second end opposite the first end.

Example 45 includes the subject matter of Example 43 or 44, wherein the body includes one or more nanowires and/or nanoribbons, and the gate structure wraps around the one or more nanowires and/or nanoribbons.

Example 46 includes the subject matter of any of Examples 43-45, wherein the layer of high-κ dielectric is a composite layer that includes a first layer of high-κ dielectric and a second layer of high-κ dielectric on the first layer of high-κ dielectric, the first layer of high-κ dielectric being compositionally distinct from the second layer of high-κ dielectric.

Example 47 includes the subject matter of any of Examples 43-46, wherein the first layer of high-κ dielectric comprises zirconium and oxygen and the second layer of high-κ dielectric comprises hafnium and oxygen.

Example 48 includes the subject matter of any of Examples 43-47, wherein N is six or more.

Example 49 includes the subject matter of Example 48, wherein N is nine or more.

Example 50 is a computing system comprising the integrated circuit of any of claims 1-42.

Example 51 includes the subject matter of Example 50 and further comprises a touch screen display.

Example 52 includes the subject matter of Example 50 or 51 and further comprises a processor.

Example 53 includes the subject matter of any of Examples 50-52 and further comprises a communication chip.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
    a source region;
    a drain region; and
    a portion of semiconductor material between the source region and the drain region;
    a gate structure in contact with the portion of semiconductor material between the source region and the drain region, the gate structure comprising a gate dielectric structure on the portion of semiconductor material and including N hybrid stacks of dielectric material, each of first and second hybrid stacks included in the N hybrid stacks comprising a layer of low-κ dielectric having a thickness, and a layer of high-κ dielectric on the layer of low-κ dielectric, wherein the layer of high-κ dielectric has a thickness at least two times the thickness of the layer of low-κ dielectric;
    wherein N is 2 or more; and
    a gate electrode in contact with the gate dielectric structure.

2. The integrated circuit of claim 1, wherein first low-κ dielectric comprises aluminum and oxygen.

3. The integrated circuit of claim 1, wherein the thickness of the layer of low-κ dielectric is no greater than 1.5 nm.

4. The integrated circuit of claim 1, wherein the layer of high-κ dielectric is a composite layer that includes a first high-κ layer and a second high-κ layer, the second high-kappa layer being compositionally distinct from the first high-κ layer.

5. The integrated circuit of claim 4, wherein the first high-κ layer comprises zirconium and oxygen, and the second high-κ layer comprises hafnium and oxygen.

6. The integrated circuit of claim 5, wherein a thickness of the first high-κ layer is less than 1 nm and a thickness of the second high-κ layer is less than 1 nm.

7. The integrated circuit of claim 4, wherein at least one of the first high-κ dielectric and the second high-κ dielectric comprises hafnium and oxygen.

8. The integrated circuit of claim 1, wherein a thickness of the layer of high-κ dielectric is three to five times thicker than the layer of low-κ dielectric.

9. The integrated circuit of claim 1, wherein N is at least 5, and each of the at least 5 hybrid stacks includes the layer of low-κ dielectric and the layer of high-κ dielectric.

10. The integrated circuit of claim 1, wherein N is at least 8, and each of the 8 or more hybrid stacks includes the layer of low-κ dielectric and the layer of high-κ dielectric.

11. The integrated circuit of claim 1, wherein source region and the drain region are compositionally distinct from the portion of semiconductor material between the source region and the drain region.

12. The integrated circuit of claim 1, wherein the source region, the drain region, and the portion of semiconductor material between the source region and the drain region are a continuous body of semiconductor material.

13. An integrated circuit comprising:
    a body of semiconductor material;
    a source region contacting a first surface of the body;
    a drain region contacting a second surface of the body; and a gate structure including a gate dielectric and a gate electrode, the gate dielectric in contact with the body of semiconductor material and including first and second hybrid stacks of dielectric material, each of the first and second hybrid stacks including a layer of low-κ dielectric and a layer of high-κ dielectric on the layer of low-κ dielectric, and the gate electrode in contact with the layer of high-κ dielectric of an uppermost hybrid stack included in the two or more hybrid stacks of dielectric material, wherein a ratio of thicknesses of the layer of high-κ dielectric to the layer of low-κ dielectric is at least 3:1 for one or more of the hybrid stacks.

14. The integrated circuit of claim 13, wherein the body of semiconductor material includes one or more nanowires and/or nanoribbons, and the gate structure wraps around the one or more nanowires and/or nanoribbons.

15. The integrated circuit of claim 13, wherein the layer of high-κ dielectric is a composite layer that includes a first layer of high-κ dielectric and a second layer of high-κ dielectric on the first layer of high-κ dielectric, the first layer of high-κ dielectric being compositionally distinct from the second layer of high-κ dielectric.

16. The integrated circuit of claim 15, wherein the first layer of high-κ dielectric comprises zirconium and oxygen and the second layer of high-κ dielectric comprises hafnium and oxygen.

17. The integrated circuit of claim 16, wherein the gate dielectric includes at least six hybrid stacks of dielectric material.

* * * * *